US012332127B2

(12) United States Patent
Tsai et al.

(10) Patent No.: US 12,332,127 B2
(45) Date of Patent: Jun. 17, 2025

(54) SEALED FORCE SENSOR WITH ETCH STOP LAYER

(71) Applicant: NextInput, Inc., San Jose, CA (US)

(72) Inventors: Julius Minglin Tsai, San Jose, CA (US); Ryan Diestelhorst, Sunnyvale, CA (US); Dan Krstyen Benjamin, Marietta, GA (US)

(73) Assignee: NextInput, Inc., Mountain View, CA (US)

( * ) Notice: Subject to any disclaimer, the term of this patent is extended or adjusted under 35 U.S.C. 154(b) by 0 days.

(21) Appl. No.: 18/597,341

(22) Filed: Mar. 6, 2024

(65) Prior Publication Data
US 2024/0247986 A1 Jul. 25, 2024

Related U.S. Application Data

(63) Continuation of application No. 17/860,941, filed on Jul. 8, 2022, now Pat. No. 11,965,787, which is a
(Continued)

(51) Int. Cl.
*G01L 1/18* (2006.01)
*B81B 3/00* (2006.01)
(Continued)

(52) U.S. Cl.
CPC .............. *G01L 1/18* (2013.01); *B81B 3/0021* (2013.01); *B81C 1/00595* (2013.01); *G01L 1/26* (2013.01);
(Continued)

(58) Field of Classification Search
CPC ........... G01L 1/18; G01L 1/26; B81B 3/0021; B81B 2203/0127; B81C 1/00595; B81C 2201/014
See application file for complete search history.

(56) References Cited

U.S. PATENT DOCUMENTS

| 4,594,639 A | 6/1986 | Kuisma |
| 4,658,651 A | 4/1987 | Le |

(Continued)

FOREIGN PATENT DOCUMENTS

| CN | 201653605 U | 11/2010 |
| CN | 102998037 A | 3/2013 |

(Continued)

OTHER PUBLICATIONS

Mei, et al., "Design and Fabrication of an Integrated Three-Dimensional Tactile Sensor for Space Robotic Applications," International Conference on Micro Electro Mechanical Systems, Jan. 1999, Orlando, Florida, IEEE, pp. 112-117.
(Continued)

*Primary Examiner* — David Z Huang
*Assistant Examiner* — Jean F Morello
(74) *Attorney, Agent, or Firm* — Withrow & Terranova, P.L.L.C.

(57) ABSTRACT

An example microelectromechanical system (MEMS) force sensor is described herein. The MEMS force sensor can include a sensor die configured to receive an applied force. The sensor die can include a first substrate and a second substrate, where a cavity is formed in the first substrate and where at least a portion of the second substrate defines a deformable membrane. The MEMS force sensor can also include an etch stop layer arranged between the first substrate and the second substrate, and a sensing element arranged on a surface of the second substrate. The sensing element can be configured to convert a strain on the surface of the membrane substrate to an analog electrical signal that is proportional to the strain.

20 Claims, 5 Drawing Sheets

Related U.S. Application Data continuation of application No. 16/761,373, filed as application No. PCT/US2018/058928 on Nov. 2, 2018, now Pat. No. 11,385,108.

(60) Provisional application No. 62/580,530, filed on Nov. 2, 2017.

(51) Int. Cl.
*B81C 1/00* (2006.01)
*G01L 1/26* (2006.01)

(52) U.S. Cl.
CPC . *B81B 2203/0127* (2013.01); *B81C 2201/014* (2013.01)

(56) References Cited

U.S. PATENT DOCUMENTS

| | | | |
|---|---|---|---|
| 4,814,856 A | 3/1989 | Kurtz et al. |
| 4,849,730 A | 7/1989 | Izumi et al. |
| 4,914,624 A | 4/1990 | Dunthorn |
| 4,918,262 A | 4/1990 | Flowers et al. |
| 4,933,660 A | 6/1990 | Wynne, Jr. |
| 4,983,786 A | 1/1991 | Stevens et al. |
| 5,095,401 A | 3/1992 | Zavracky et al. |
| 5,159,159 A | 10/1992 | Asher |
| 5,237,879 A | 8/1993 | Speeter |
| 5,320,705 A | 6/1994 | Fujii et al. |
| 5,333,505 A | 8/1994 | Takahashi et al. |
| 5,343,220 A | 8/1994 | Veasy et al. |
| 5,349,746 A | 9/1994 | Gruenwald et al. |
| 5,351,550 A | 10/1994 | Maurer |
| 5,483,994 A | 1/1996 | Maurer |
| 5,510,812 A | 4/1996 | O'Mara et al. |
| 5,541,372 A | 7/1996 | Baller et al. |
| 5,543,591 A | 8/1996 | Gillespie et al. |
| 5,565,657 A | 10/1996 | Merz |
| 5,600,074 A | 2/1997 | Marek et al. |
| 5,673,066 A | 9/1997 | Toda et al. |
| 5,773,728 A | 6/1998 | Tsukada et al. |
| 5,889,236 A | 3/1999 | Gillespie et al. |
| 5,921,896 A | 7/1999 | Boland |
| 5,969,591 A | 10/1999 | Fung |
| 6,028,271 A | 2/2000 | Gillespie et al. |
| 6,159,166 A | 12/2000 | Chesney et al. |
| 6,243,075 B1 | 6/2001 | Fishkin et al. |
| 6,348,663 B1 | 2/2002 | Schoos et al. |
| 6,351,205 B1 | 2/2002 | Armstrong |
| 6,360,598 B1 | 3/2002 | Calame et al. |
| 6,437,682 B1 | 8/2002 | Vance |
| 6,555,235 B1 | 4/2003 | Aufderheide et al. |
| 6,556,189 B1 | 4/2003 | Takahata et al. |
| 6,569,108 B2 | 5/2003 | Sarvazyan et al. |
| 6,610,936 B2 | 8/2003 | Gillespie et al. |
| 6,620,115 B2 | 9/2003 | Sarvazyan et al. |
| 6,629,343 B1 | 10/2003 | Chesney et al. |
| 6,668,230 B2 | 12/2003 | Mansky et al. |
| 6,720,712 B2 | 4/2004 | Scott et al. |
| 6,788,297 B2 | 9/2004 | Itoh et al. |
| 6,801,191 B2 | 10/2004 | Mukai et al. |
| 6,809,280 B2 | 10/2004 | Divigalpitiya et al. |
| 6,812,621 B2 | 11/2004 | Scott |
| 6,822,640 B2 | 11/2004 | Derocher |
| 6,868,731 B1 | 3/2005 | Gatesman |
| 6,879,318 B1 | 4/2005 | Chan et al. |
| 6,888,537 B2 | 5/2005 | Benson et al. |
| 6,915,702 B2 | 7/2005 | Omura et al. |
| 6,931,938 B2 | 8/2005 | Knirck et al. |
| 6,995,752 B2 | 2/2006 | Lu |
| 7,138,984 B1 | 11/2006 | Miles |
| 7,173,607 B2 | 2/2007 | Matsumoto et al. |
| 7,190,350 B2 | 3/2007 | Roberts |
| 7,215,329 B2 | 5/2007 | Yoshikawa et al. |
| 7,218,313 B2 | 5/2007 | Marcus et al. |
| 7,224,257 B2 | 5/2007 | Morikawa |
| 7,245,293 B2 | 7/2007 | Hoshino et al. |
| 7,273,979 B2 | 9/2007 | Christensen |
| 7,280,097 B2 | 10/2007 | Chen et al. |
| 7,318,349 B2 | 1/2008 | Vaganov et al. |
| 7,324,094 B2 | 1/2008 | Moilanen et al. |
| 7,324,095 B2 | 1/2008 | Sharma |
| 7,336,260 B2 | 2/2008 | Martin et al. |
| 7,337,085 B2 | 2/2008 | Soss |
| 7,345,680 B2 | 3/2008 | David |
| 7,367,232 B2 | 5/2008 | Vaganov et al. |
| 7,406,661 B2 | 7/2008 | Vaananen et al. |
| 7,425,749 B2 | 9/2008 | Hartzell et al. |
| 7,426,873 B1 | 9/2008 | Kholwadwala et al. |
| 7,449,758 B2 | 11/2008 | Axelrod et al. |
| 7,460,109 B2 | 12/2008 | Safai et al. |
| 7,476,952 B2 | 1/2009 | Vaganov et al. |
| 7,499,604 B1 | 3/2009 | Burns |
| 7,508,040 B2 | 3/2009 | Nikkel et al. |
| 7,554,167 B2 | 6/2009 | Vaganov |
| 7,607,111 B2 | 10/2009 | Vaananen et al. |
| 7,620,521 B2 | 11/2009 | Breed et al. |
| 7,629,969 B2 | 12/2009 | Kent |
| 7,649,522 B2 | 1/2010 | Chen et al. |
| 7,663,612 B2 | 2/2010 | Bladt |
| 7,685,538 B2 | 3/2010 | Fleck et al. |
| 7,698,084 B2 | 4/2010 | Soss |
| 7,701,445 B2 | 4/2010 | Inokawa et al. |
| 7,719,752 B2 | 5/2010 | Sampsell et al. |
| 7,746,327 B2 | 6/2010 | Miyakoshi |
| 7,791,151 B2 | 9/2010 | Vaganov et al. |
| 7,819,998 B2 | 10/2010 | David |
| 7,825,911 B2 | 11/2010 | Sano et al. |
| 7,903,090 B2 | 3/2011 | Soss et al. |
| 7,921,725 B2 | 4/2011 | Silverbrook et al. |
| 7,952,566 B2 | 5/2011 | Poupyrev et al. |
| 7,973,772 B2 | 7/2011 | Gettemy et al. |
| 7,973,778 B2 | 7/2011 | Chen |
| 8,004,052 B2 | 8/2011 | Vaganov |
| 8,004,501 B2 | 8/2011 | Harrison |
| 8,013,843 B2 | 9/2011 | Pryor |
| 8,026,906 B2 | 9/2011 | Molne et al. |
| 8,044,929 B2 | 10/2011 | Baldo et al. |
| 8,068,100 B2 | 11/2011 | Pryor |
| 8,072,437 B2 | 12/2011 | Miller et al. |
| 8,072,440 B2 | 12/2011 | Pryor |
| 8,113,065 B2 | 2/2012 | Ohsato et al. |
| 8,120,586 B2 | 2/2012 | Hsu et al. |
| 8,120,588 B2 | 2/2012 | Klinghult |
| 8,130,207 B2 | 3/2012 | Nurmi et al. |
| 8,134,535 B2 | 3/2012 | Choi et al. |
| 8,139,038 B2 | 3/2012 | Chueh et al. |
| 8,144,133 B2 | 3/2012 | Wang et al. |
| 8,149,211 B2 | 4/2012 | Hayakawa et al. |
| 8,154,528 B2 | 4/2012 | Chen et al. |
| 8,159,473 B2 | 4/2012 | Cheng et al. |
| 8,164,573 B2 | 4/2012 | DaCosta et al. |
| 8,183,077 B2 | 5/2012 | Vaganov et al. |
| 8,184,093 B2 | 5/2012 | Tsuiki |
| 8,188,985 B2 | 5/2012 | Hillis et al. |
| 8,199,116 B2 | 6/2012 | Jeon et al. |
| 8,212,790 B2 | 7/2012 | Rimas Ribikauskas et al. |
| 8,237,537 B2 | 8/2012 | Kurtz |
| 8,243,035 B2 | 8/2012 | Abe et al. |
| 8,250,921 B2 | 8/2012 | Nasiri et al. |
| 8,253,699 B2 | 8/2012 | Son |
| 8,260,337 B2 | 9/2012 | Periyalwar et al. |
| 8,269,731 B2 | 9/2012 | Molne |
| 8,289,288 B2 | 10/2012 | Whytock et al. |
| 8,289,290 B2 | 10/2012 | Klinghult |
| 8,297,127 B2 | 10/2012 | Wade et al. |
| 8,319,739 B2 | 11/2012 | Chu et al. |
| 8,325,143 B2 | 12/2012 | Destura et al. |
| 8,350,345 B2 | 1/2013 | Vaganov |
| 8,363,020 B2 | 1/2013 | Li et al. |
| 8,363,022 B2 | 1/2013 | Tho et al. |
| 8,378,798 B2 | 2/2013 | Bells et al. |
| 8,378,991 B2 | 2/2013 | Jeon et al. |
| 8,384,677 B2 | 2/2013 | Mak-Fan et al. |
| 8,387,464 B2 | 3/2013 | McNeil et al. |

(56) References Cited

U.S. PATENT DOCUMENTS

| | | |
|---|---|---|
| 8,405,631 B2 | 3/2013 | Chu et al. |
| 8,405,632 B2 | 3/2013 | Chu et al. |
| 8,421,609 B2 | 4/2013 | Kim et al. |
| 8,427,441 B2 | 4/2013 | Paleczny et al. |
| 8,436,806 B2 | 5/2013 | Almalki et al. |
| 8,436,827 B1 | 5/2013 | Zhai et al. |
| 8,451,245 B2 | 5/2013 | Heubel et al. |
| 8,456,440 B2 | 6/2013 | Abe et al. |
| 8,466,889 B2 | 6/2013 | Tong et al. |
| 8,477,115 B2 | 7/2013 | Rekimoto |
| 8,482,372 B2 | 7/2013 | Kurtz et al. |
| 8,493,189 B2 | 7/2013 | Suzuki |
| 8,497,757 B2 | 7/2013 | Kurtz et al. |
| 8,516,906 B2 | 8/2013 | Umetsu et al. |
| 8,802,473 B1 | 8/2014 | Chu et al. |
| 8,931,347 B2 | 1/2015 | Donzier et al. |
| 8,984,951 B2 | 3/2015 | Landmann et al. |
| 9,487,388 B2 | 11/2016 | Brosh |
| 9,493,342 B2 | 11/2016 | Brosh |
| 10,378,985 B2 | 8/2019 | Kwa |
| 11,385,108 B2 | 7/2022 | Tsai et al. |
| 2003/0067448 A1 | 4/2003 | Park |
| 2003/0119221 A1 | 6/2003 | Cunningham |
| 2003/0189552 A1 | 10/2003 | Chuang et al. |
| 2003/0197176 A1 | 10/2003 | Spallas et al. |
| 2004/0012572 A1 | 1/2004 | Sowden et al. |
| 2004/0140966 A1 | 7/2004 | Marggraff et al. |
| 2006/0028441 A1 | 2/2006 | Armstrong |
| 2006/0244733 A1 | 11/2006 | Geaghan |
| 2006/0272413 A1 | 12/2006 | Vaganov et al. |
| 2006/0284856 A1 | 12/2006 | Soss |
| 2007/0035525 A1 | 2/2007 | Yeh et al. |
| 2007/0046649 A1 | 3/2007 | Reiner |
| 2007/0070046 A1 | 3/2007 | Sheynblat et al. |
| 2007/0070053 A1 | 3/2007 | Lapstun et al. |
| 2007/0097095 A1 | 5/2007 | Kim et al. |
| 2007/0103449 A1 | 5/2007 | Laitinen et al. |
| 2007/0103452 A1 | 5/2007 | Wakai et al. |
| 2007/0115265 A1 | 5/2007 | Rainisto |
| 2007/0132717 A1 | 6/2007 | Wang et al. |
| 2007/0137901 A1 | 6/2007 | Chen |
| 2007/0139391 A1 | 6/2007 | Bischoff |
| 2007/0152959 A1 | 7/2007 | Peters |
| 2007/0156723 A1 | 7/2007 | Vaananen |
| 2007/0182864 A1 | 8/2007 | Stoneham et al. |
| 2007/0229478 A1 | 10/2007 | Rosenberg et al. |
| 2007/0235231 A1 | 10/2007 | Loomis et al. |
| 2007/0245836 A1 | 10/2007 | Vaganov |
| 2007/0262965 A1 | 11/2007 | Hirai et al. |
| 2007/0277616 A1 | 12/2007 | Nikkel et al. |
| 2007/0298883 A1 | 12/2007 | Feldman et al. |
| 2008/0001923 A1 | 1/2008 | Hall et al. |
| 2008/0007532 A1 | 1/2008 | Chen |
| 2008/0010616 A1 | 1/2008 | Algreatly |
| 2008/0024454 A1 | 1/2008 | Everest |
| 2008/0030482 A1 | 2/2008 | Elwell et al. |
| 2008/0036743 A1 | 2/2008 | Westerman et al. |
| 2008/0088600 A1 | 4/2008 | Prest et al. |
| 2008/0088602 A1 | 4/2008 | Hotelling |
| 2008/0094367 A1 | 4/2008 | Van De Ven et al. |
| 2008/0105057 A1 | 5/2008 | Wade |
| 2008/0105470 A1 | 5/2008 | Van De Ven et al. |
| 2008/0106523 A1 | 5/2008 | Conrad |
| 2008/0174852 A1 | 7/2008 | Hirai et al. |
| 2008/0180402 A1 | 7/2008 | Yoo et al. |
| 2008/0180405 A1 | 7/2008 | Han et al. |
| 2008/0180406 A1 | 7/2008 | Han et al. |
| 2008/0202249 A1 | 8/2008 | Yokura et al. |
| 2008/0204427 A1 | 8/2008 | Heesemans et al. |
| 2008/0211766 A1 | 9/2008 | Westerman et al. |
| 2008/0238446 A1 | 10/2008 | DeNatale et al. |
| 2008/0238884 A1 | 10/2008 | Harish |
| 2008/0259046 A1 | 10/2008 | Carsanaro |
| 2008/0279498 A1 | 11/2008 | Sampsell et al. |
| 2008/0284742 A1 | 11/2008 | Prest et al. |
| 2008/0303799 A1 | 12/2008 | Schwesig et al. |
| 2009/0027352 A1 | 1/2009 | Abele |
| 2009/0027353 A1 | 1/2009 | Im et al. |
| 2009/0046110 A1 | 2/2009 | Sadler et al. |
| 2009/0102805 A1 | 4/2009 | Meijer et al. |
| 2009/0140985 A1 | 6/2009 | Liu |
| 2009/0184921 A1 | 7/2009 | Scott et al. |
| 2009/0184936 A1 | 7/2009 | Algreatly |
| 2009/0213066 A1 | 8/2009 | Hardacker et al. |
| 2009/0237275 A1 | 9/2009 | Vaganov |
| 2009/0237374 A1 | 9/2009 | Li et al. |
| 2009/0242282 A1 | 10/2009 | Kim et al. |
| 2009/0243817 A1 | 10/2009 | Son |
| 2009/0243998 A1 | 10/2009 | Wang |
| 2009/0256807 A1 | 10/2009 | Nurmi |
| 2009/0256817 A1 | 10/2009 | Perlin et al. |
| 2009/0282930 A1 | 11/2009 | Cheng et al. |
| 2009/0303400 A1 | 12/2009 | Hou et al. |
| 2009/0309852 A1 | 12/2009 | Lin et al. |
| 2009/0314551 A1 | 12/2009 | Nakajima |
| 2010/0013785 A1 | 1/2010 | Murai et al. |
| 2010/0020030 A1 | 1/2010 | Kim et al. |
| 2010/0020039 A1 | 1/2010 | Ricks et al. |
| 2010/0039396 A1 | 2/2010 | Ho et al. |
| 2010/0053087 A1 | 3/2010 | Dai et al. |
| 2010/0053116 A1 | 3/2010 | Daverman et al. |
| 2010/0066686 A1 | 3/2010 | Joguet et al. |
| 2010/0066697 A1 | 3/2010 | Jacomet et al. |
| 2010/0079391 A1 | 4/2010 | Joung |
| 2010/0079395 A1 | 4/2010 | Kim et al. |
| 2010/0079398 A1 | 4/2010 | Shen et al. |
| 2010/0097347 A1 | 4/2010 | Lin |
| 2010/0117978 A1 | 5/2010 | Shirado |
| 2010/0123671 A1 | 5/2010 | Lee |
| 2010/0123686 A1 | 5/2010 | Klinghult et al. |
| 2010/0127140 A1 | 5/2010 | Smith |
| 2010/0128002 A1 | 5/2010 | Stacy et al. |
| 2010/0128337 A1 | 5/2010 | Tung |
| 2010/0153891 A1 | 6/2010 | Vaananen et al. |
| 2010/0164959 A1 | 7/2010 | Brown et al. |
| 2010/0220065 A1 | 9/2010 | Ma |
| 2010/0271325 A1 | 10/2010 | Conte et al. |
| 2010/0289807 A1 | 11/2010 | Yu et al. |
| 2010/0295807 A1 | 11/2010 | Xie et al. |
| 2010/0308844 A1 | 12/2010 | Day et al. |
| 2010/0309714 A1 | 12/2010 | Meade |
| 2010/0315373 A1 | 12/2010 | Steinhauser et al. |
| 2010/0321310 A1 | 12/2010 | Kim et al. |
| 2010/0321319 A1 | 12/2010 | Hefti |
| 2010/0323467 A1 | 12/2010 | Vaganov et al. |
| 2010/0328229 A1 | 12/2010 | Weber et al. |
| 2010/0328230 A1 | 12/2010 | Faubert et al. |
| 2011/0001723 A1 | 1/2011 | Fan |
| 2011/0006980 A1 | 1/2011 | Taniguchi et al. |
| 2011/0007008 A1 | 1/2011 | Algreatly |
| 2011/0012848 A1 | 1/2011 | Li et al. |
| 2011/0018820 A1 | 1/2011 | Huitema et al. |
| 2011/0032211 A1 | 2/2011 | Christofferson |
| 2011/0039602 A1 | 2/2011 | McNamara et al. |
| 2011/0050628 A1 | 3/2011 | Homma et al. |
| 2011/0050630 A1 | 3/2011 | Ikeda |
| 2011/0057899 A1 | 3/2011 | Sleeman et al. |
| 2011/0063248 A1 | 3/2011 | Yoon |
| 2011/0113881 A1 | 5/2011 | Suzuki |
| 2011/0128250 A1 | 6/2011 | Murphy et al. |
| 2011/0141052 A1 | 6/2011 | Bernstein et al. |
| 2011/0141053 A1 | 6/2011 | Bulea et al. |
| 2011/0187674 A1 | 8/2011 | Baker et al. |
| 2011/0209555 A1 | 9/2011 | Ahles et al. |
| 2011/0227836 A1 | 9/2011 | Li et al. |
| 2011/0242014 A1 | 10/2011 | Tsai et al. |
| 2011/0267181 A1 | 11/2011 | Kildal |
| 2011/0267294 A1 | 11/2011 | Kildal |
| 2011/0273396 A1 | 11/2011 | Chung |
| 2011/0291951 A1 | 12/2011 | Tong |
| 2011/0298705 A1 | 12/2011 | Vaganov |
| 2011/0308324 A1 | 12/2011 | Gamage et al. |
| 2012/0004169 A1 | 1/2012 | Sebti et al. |
| 2012/0032907 A1 | 2/2012 | Koizumi et al. |

(56) References Cited

U.S. PATENT DOCUMENTS

| | | |
|---|---|---|
| 2012/0032915 A1 | 2/2012 | Wittorf |
| 2012/0038579 A1 | 2/2012 | Sasaki |
| 2012/0050159 A1 | 3/2012 | Yu et al. |
| 2012/0050208 A1 | 3/2012 | Dietz |
| 2012/0056837 A1 | 3/2012 | Park et al. |
| 2012/0060605 A1 | 3/2012 | Wu et al. |
| 2012/0062603 A1 | 3/2012 | Mizunuma et al. |
| 2012/0068946 A1 | 3/2012 | Tang et al. |
| 2012/0068969 A1 | 3/2012 | Bogana et al. |
| 2012/0081327 A1 | 4/2012 | Heubel et al. |
| 2012/0086659 A1 | 4/2012 | Perlin et al. |
| 2012/0086764 A1 | 4/2012 | Golda et al. |
| 2012/0092250 A1 | 4/2012 | Hadas et al. |
| 2012/0092279 A1 | 4/2012 | Martin |
| 2012/0092299 A1 | 4/2012 | Harada et al. |
| 2012/0092324 A1 | 4/2012 | Buchan et al. |
| 2012/0105358 A1 | 5/2012 | Momeyer et al. |
| 2012/0105367 A1 | 5/2012 | Son et al. |
| 2012/0113061 A1 | 5/2012 | Ikeda |
| 2012/0127088 A1 | 5/2012 | Pance et al. |
| 2012/0127107 A1 | 5/2012 | Miyashita et al. |
| 2012/0139864 A1 | 6/2012 | Sleeman et al. |
| 2012/0144921 A1 | 6/2012 | Bradley et al. |
| 2012/0146945 A1 | 6/2012 | Miyazawa et al. |
| 2012/0146946 A1 | 6/2012 | Wang et al. |
| 2012/0147052 A1 | 6/2012 | Homma et al. |
| 2012/0154315 A1 | 6/2012 | Aono |
| 2012/0154316 A1 | 6/2012 | Kono |
| 2012/0154317 A1 | 6/2012 | Aono |
| 2012/0154318 A1 | 6/2012 | Aono |
| 2012/0154328 A1 | 6/2012 | Kono |
| 2012/0154329 A1 | 6/2012 | Shinozaki |
| 2012/0154330 A1 | 6/2012 | Shimizu |
| 2012/0162122 A1 | 6/2012 | Geaghan |
| 2012/0169609 A1 | 7/2012 | Britton |
| 2012/0169617 A1 | 7/2012 | Maenpaa |
| 2012/0169635 A1 | 7/2012 | Liu |
| 2012/0169636 A1 | 7/2012 | Liu |
| 2012/0188181 A1 | 7/2012 | Ha et al. |
| 2012/0194460 A1 | 8/2012 | Kuwabara et al. |
| 2012/0194466 A1 | 8/2012 | Posamentier |
| 2012/0200526 A1 | 8/2012 | Lackey |
| 2012/0204653 A1 | 8/2012 | August et al. |
| 2012/0205165 A1 | 8/2012 | Strittmatter et al. |
| 2012/0218212 A1 | 8/2012 | Yu et al. |
| 2012/0286379 A1 | 11/2012 | Inoue |
| 2012/0319987 A1 | 12/2012 | Woo |
| 2012/0327025 A1 | 12/2012 | Huska et al. |
| 2013/0008263 A1 | 1/2013 | Kabasawa et al. |
| 2013/0038541 A1 | 2/2013 | Bakker |
| 2013/0093685 A1 | 4/2013 | Kalu et al. |
| 2013/0096849 A1 | 4/2013 | Campbell et al. |
| 2013/0140944 A1 | 6/2013 | Chen et al. |
| 2013/0341741 A1 | 12/2013 | Brosh |
| 2013/0341742 A1 | 12/2013 | Brosh |
| 2014/0007705 A1 | 1/2014 | Campbell et al. |
| 2014/0028575 A1 | 1/2014 | Parivar et al. |
| 2014/0055407 A1 | 2/2014 | Lee et al. |
| 2014/0367811 A1 | 12/2014 | Nakagawa et al. |
| 2016/0069927 A1 | 3/2016 | Hamamura |
| 2016/0332866 A1 | 11/2016 | Brosh et al. |
| 2016/0363490 A1 | 12/2016 | Campbell et al. |
| 2017/0003187 A1 | 1/2017 | Lim et al. |
| 2017/0234744 A1 | 8/2017 | Tung et al. |
| 2017/0343430 A1 | 11/2017 | Caltabiano et al. |
| 2021/0172813 A1 | 6/2021 | Tsai et al. |
| 2021/0407941 A1 | 12/2021 | Haba |
| 2023/0016531 A1 | 1/2023 | Tsai et al. |

FOREIGN PATENT DOCUMENTS

| | | |
|---|---|---|
| DE | 102010012441 A | 9/2011 |
| JP | 2004156937 A | 6/2004 |
| JP | 2010147268 A | 7/2010 |
| WO | 2004113859 A | 12/2004 |
| WO | 2007139695 A | 12/2007 |
| WO | 2013067548 A | 5/2013 |

OTHER PUBLICATIONS

Nesterov, V., et al., "Modelling and investigation of the silicon twin design 3D micro probe," Journal of Micromechanics and Microengineering, vol. 15, 2005, pp. 514-520.

Non-Final Office Action for U.S. Appl. No. 16/761,373, mailed Sep. 22, 2021, 7 pages.

Notice of Allowance for U.S. Appl. No. 16/761,373, mailed Feb. 25, 2022, 7 pages.

PCT/US2018/058928, International Search Report and Written Opinion issued on Jan. 7, 2019.

Non-Final Office Action for U.S. Appl. No. 17/860,941, mailed May 18, 2023, 11 pages.

Final Office Action for U.S. Appl. No. 17/860,941, mailed Sep. 7, 2023, 7 pages.

Notice of Allowance for U.S. Appl. No. 17/860,941, mailed Dec. 19, 2023, 6 pages.

Supplemental Notice of Allowability for U.S. Appl. No. 17/860,941, mailed Dec. 27, 2023, 3 pages.

SEALED FORCE SENSOR WITH ETCH STOP LAYER

RELATED APPLICATIONS

This application is a continuation of U.S. patent application Ser. No. 17/860,941, filed Jul. 8, 2022, now U.S. Pat. No. 11,965,787, which is a continuation of U.S. patent application Ser. No. 16/761,373, filed May 4, 2020, now U.S. Pat. No. 11,385,108, which is a national phase filing of International Application No. PCT/US2018/058928, filed Nov. 2, 2017, which claims the benefit of provisional patent application Ser. No. 62/580,530, filed Nov. 2, 2017, the disclosures of which are hereby incorporated herein by reference in their entirety.

FIELD OF THE DISCLOSURE

The present disclosure relates to a microelectromechanical system (MEMS) sensor for force sensing, including an etch stop layer for precise membrane thickness control.

BACKGROUND

Microelectromechanical system (MEMS) force sensors are typically designed with a membrane that deforms with applied force. Deformation of the membrane mechanically amplifies the stress induced by the load. The sensitivity of the MEMS force sensor is mainly dominated by the thickness of the membrane. Thinner membranes cause the sensitivity to increase, while thicker membranes cause the sensitivity to decrease. When membrane thickness is controlled through the etch process, there is still a large variation in sensitivity, e.g., in the range of 10% to 20%. On the other hand, other processes such as grinding and polishing of the membrane can produce much better tolerances, e.g., in the range of less than 5%.

SUMMARY

In one implementation, the present disclosure pertains to an etch stop layer performed before the cavity etch. The membrane thickness is precisely controlled by the thickness of the silicon layer during grinding/polishing, epi-growth, or other deposition methods. The etch stop layer then absorbs all the etch non-uniformity during the cavity etch due to the larger etch ratio between the silicon and the etch layer. The etch stop layer can later be selectively removed, leaving only silicon as the membrane material. Mesas can also be selectively formed on the membrane sealed inside the cavity for overload protection.

An example microelectromechanical system (MEMS) force sensor is described herein. The MEMS force sensor can include a sensor die configured to receive an applied force. The sensor die can include a first substrate and a second substrate, where a cavity is formed in the first substrate and where at least a portion of the second substrate defines a deformable membrane. The MEMS force sensor can also include an etch stop layer arranged between the first substrate and the second substrate, and a sensing element arranged on a surface of the second substrate. The sensing element can be configured to convert a strain on the surface of the membrane substrate to an analog electrical signal that is proportional to the strain.

Additionally, the etch stop layer can be configured for precise thickness control of the deformable membrane of the membrane substrate. For example, an etch rate of the etch stop layer can be different than an etch rate of the first substrate. Optionally, an etch rate ratio between the etch rate of the first substrate and the etch rate of the etch stop layer can be between 50 and 150.

Alternatively, or additionally, the MEMS force sensor can further include a protective layer arranged on the surface of the second substrate, and a conductive pad arranged on the protective layer. The sensing element can be electrically coupled to the conductive pad, where the protective layer at least partially covers one or more of the sensing elements, the surface of the second substrate, and the conductive pad.

In some implementations, the MEMS force sensor can further include an under bump metal (UBM) layer and a solder bump, where the MEMS force sensor is mounted on a package substrate using the UBM layer and the solder bump. Optionally, the conductive pad, the UBM layer, and the solder bump can be fully overlapping with a mesa formed from the first substrate. Alternatively, the conductive pad, the UBM layer, and the solder bump cannot be overlapping with a mesa formed from the first substrate or the deformable membrane defined by the second substrate.

Alternatively, or additionally, the conductive pad can be electrically coupled to the package substrate through the UBM layer and the solder bump.

Alternatively, or additionally, the package substrate can be a printed circuit board (PCB) or a flexible printed circuit board (FPCB).

Alternatively, or additionally, the MEMS force sensor can further include a mesa formed from the first substrate.

Alternatively, or additionally, the etch stop layer can cover the deformable membrane of the membrane substrate.

Alternatively, or additionally, the etch stop layer can be removed from the deformable membrane of the membrane substrate.

Alternatively, or additionally, the etch stop layer can be composed of silicon dioxide, silicon nitride, or sapphire.

Alternatively, or additionally, the MEMS force sensor can further include a plurality of sensing elements arranged on the surface of the second substrate.

Alternatively, or additionally, the sensing element can be a piezoresistive or piezoelectric sensing element.

Alternatively, or additionally, the MEMS force sensor can further include a cap substrate, wherein the cap substrate is bonded to the first substrate, and wherein the cavity is sealed between the cap substrate and the first substrate.

An example method of manufacturing a MEMS force sensor is also described herein. The method can include providing a first substrate, a second substrate, and an etch stop layer, where the etch stop layer is arranged between the first and second substrates, and where a sensing element is arranged on a surface of the second substrate. The method can also include etching the first substrate, where the etch process removes a portion of the first substrate to form a cavity in the first substrate.

Additionally, the etch process can remove a portion of the etch stop layer. Alternatively, the etch process does not remove a portion of the second substrate.

Alternatively, or additionally, the etch stop layer can be configured for precise thickness control of the deformable membrane of the membrane substrate. For example, an etch rate of the etch stop layer can be different than an etch rate of the first substrate. Optionally, an etch rate ratio between the etch rate of the first substrate and the etch rate of the etch stop layer can be between 50 and 150.

Alternatively, or additionally, the etch process can further form a mesa in the first substrate.

Alternatively, or additionally, the method can further include bonding a cap substrate to the first substrate, where the cavity is sealed between the cap substrate and the first substrate.

Alternatively, or additionally, the method can further include providing a protective layer arranged on the surface of the second substrate, and providing a conductive pad arranged on the protective layer, where the sensing element is electrically coupled to the conductive pad, and where the protective layer at least partially covers one or more of the sensing elements, the surface of the second substrate, and the conductive pad.

Alternatively, or additionally, the method can further include providing a UBM layer and a solder bump, where the UBM layer is arranged on the conductive pad and the solder bump is arranged on the UBM layer.

Alternatively, or additionally, the method can further include bonding the MEMS force sensor to a package substrate, where the MEMS force sensor is mounted on the package substrate using the UBM layer and the solder bump. The package substrate can be a PCB or a FPCB.

Alternatively, or additionally, the sensing element can be formed using an implant or deposition process.

Alternatively, or additionally, the sensing element can be at least one of a piezoresistive or piezoelectric sensing element.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWING FIGURES

The components in the drawings are not necessarily to scale relative to each other. Like reference numerals designate corresponding parts throughout the several views. These and other features of will become more apparent in the detailed description in which reference is made to the appended drawings wherein.

DETAILED DESCRIPTION

The present disclosure can be understood more readily by reference to the following detailed description, examples, drawings, and their previous and following description. However, before the present devices, systems, and/or methods are disclosed and described, it is to be understood that this disclosure is not limited to the specific devices, systems, and/or methods disclosed unless otherwise specified, and, as such, can, of course, vary. It is also to be understood that the terminology used herein is for the purpose of describing particular aspects only and is not intended to be limiting.

The following description is provided as an enabling teaching. To this end, those skilled in the relevant art will recognize and appreciate that many changes can be made, while still obtaining beneficial results. It will also be apparent that some of the desired benefits can be obtained by selecting some of the features without utilizing other features. Accordingly, those who work in the art will recognize that many modifications and adaptations may be possible and can even be desirable in certain circumstances, and are contemplated by this disclosure. Thus, the following description is provided as illustrative of the principles and not in limitation thereof.

As used throughout, the singular forms "a," "an," and "the" include plural referents unless the context clearly dictates otherwise. Thus, for example, reference to "a sensing element" can include two or more such sensing elements unless the context indicates otherwise.

The term "comprising" and variations thereof as used herein is used synonymously with the term "including" and variations thereof and are open, non-limiting terms.

Ranges can be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

As used herein, the terms "optional" or "optionally" mean that the subsequently described event or circumstance may or may not occur, and that the description includes instances where said event or circumstance occurs and instances where it does not.

The present disclosure relates to an etch stop layer for precise membrane thickness control and the package implementation for a force sensor.

Figure 1:
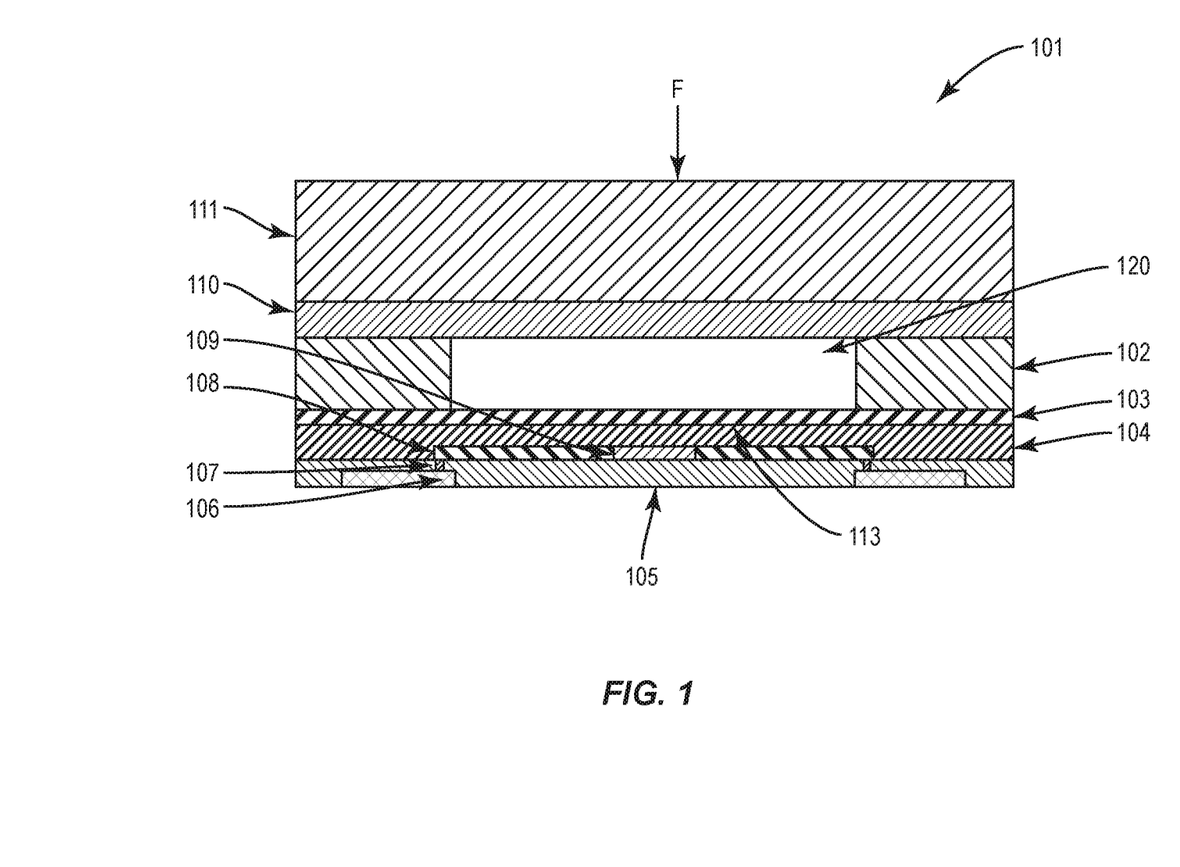
FIG. 1 illustrates an example microelectromechanical system (MEMS) force sensor with a sealed cavity and an etch stop layer.

Referring now to FIG. 1, a microelectromechanical system (MEMS) force sensor 101, according to one example implementation, is shown. The MEMS force sensor 101 can include a cavity substrate 102 (also referred to herein as a "first substrate") bonded to a membrane substrate 104 (also referred to herein as a "second substrate") through an etch stop layer 103. As described herein, at least a portion of the membrane substrate 104 forms a deformable membrane 113. A cavity 120 is etched from the cavity substrate 102. This disclosure contemplates using etching techniques known in the art to form the cavity. For example, etching processes include, but are not limited to, silicon deep reactive etch (DRIE), normal reactive etch (RIE), wet chemical etching using potassium hydroxide (KOH), or tetramethylammonium hydroxide (TMAH), all of which can be used to form the cavity. As shown in FIG. 1, the etch is stopped on the etch stop layer 103. The etch does not extend through the etch stop layer 103 and, therefore, does not reach the membrane substrate 104. The etch process is well controlled by the etch rate ratio between the respective materials of the cavity substrate 102 (e.g., silicon) and the etch stop layer 103 (e.g., silicon dioxide). For example, the etch rate ratio between an etch rate of the material of the cavity substrate 102 (e.g., silicon) and an etch rate of the material of the etch stop layer 103 can optionally be in the range from 50 to 150. In some implementations, the etch rate ratio is greater than or equal to 50. In some implementations, the etch rate ratio is greater than or equal to 60. In some implementations, the etch rate ratio is greater than or equal to 70. In some implementations, the etch rate ratio is greater than or equal to 80. In some implementations, the etch rate ratio is greater than or equal to 90. In some implementations, the etch rate ratio is greater than or equal to 100. In some implementations, the etch rate ratio is greater than or equal to 110. In some implementations, the etch rate ratio is greater than or equal to 120. In some implementations, the etch rate ratio is greater than or equal to 130. In some implementations, the etch rate ratio is greater than or equal to 140. In some implementations, the etch rate ratio is greater than or equal to 150. This disclosure contemplates using materials other than those provided as examples, such as gallium arsenide (GaAs) or silicon carbide (SiC) for the cavity substrate 102 and/or silicon nitride or sapphire for the etch stop layer 103. It should be understood that the cavity substrate and etch stop layer materials listed above are only provided as examples, and that other materials can be used.

The thickness of the deformable membrane 113, which is formed from the membrane substrate 104, can, therefore, be precisely controlled. This thickness can be precisely controlled with the processes used to fabricate the membrane substrate 104, e.g., semiconductor deposition, epitaxial growth, and/or grinding/polishing, etc. The etch stop layer 103 can absorb any non-uniformity introduced by the etch process used to form the cavity 120 in the cavity substrate 102. As discussed above, the thickness of the deformable membrane 113 affects sensitivity of the MEMS force sensor 101. Thus, by precisely controlling the deformable membrane thickness using the etch stop layer 103 to stop the etch process, it is possible to precisely control the sensitivity of the MEMS force sensor 101. The membrane substrate 104 is not etched, so the thickness of the membrane substrate 104 is not affected by the etch process. This is in contrast to the case where the deformable membrane is formed from the same substrate from which the cavity and/or mesa is formed (e.g., etched). Examples of MEMS force sensors where the deformable membrane is formed by etching a sensor substrate are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Pat. No. 9,902,611, issued Feb. 27, 2018 and entitled "Miniaturized and Ruggedized Wafer Level MEMS Force Sensors;" and U.S. Pat. No. 10,466,119, issued Nov. 5, 2019 and entitled "Ruggedized Wafer Level MEMS Force Sensor with a Tolerance Trench," the disclosures of which are incorporated by reference in their entireties. In other words, the deformable membrane 113 is formed from a different substrate (e.g., the membrane substrate 104) than the substrate etched to form the cavity (e.g., the cavity substrate 102).

The MEMS force sensor 101 can include a cap substrate 111. The cap substrate 111 can be formed of a glass (e.g., borosilicate glass) or a silicon. Although glass and silicon are provided as example materials, it should be understood that the cap substrate 111 can be made of other suitable materials. The cap substrate 111 can be bonded to the cavity substrate 102 using techniques known in the art that are including, but not limited to, silicon fusion bonding, anodic bonding, glass frit, thermo-compression, and eutectic bonding. For example, as shown in FIG. 1, the cavity substrate 102 is bonded to the cap substrate 111 through a bond layer 110. This disclosure contemplates that the bond layer 110 can optionally be formed of a silicon oxide. As described below, the cavity 120 is sealed between the cavity substrate 102 and the cap substrate 111. Thus, a volume enclosed by the cap substrate 111 and the cavity substrate 102 is sealed from an environment external to the MEMS force sensor 101. The cavity 120 is formed by removing (e.g., by etch process) portions of the cavity substrate 102 and/or the etch stop layer 103 and sealing the volume between the cap substrate 111 and the cavity substrate 102. Example MEMS force sensors that have a sealed cavity are described in U.S. Pat. No. 9,902,611, issued Feb. 27, 2018 and entitled "Miniaturized and Ruggedized Wafer Level MEMS Force Sensors;" and U.S. Pat. No. 10,466,119, issued Nov. 5, 2019 and entitled "Ruggedized Wafer Level MEMS Force Sensor with a Tolerance Trench," the disclosures of which are incorporated by reference in their entireties.

The MEMS force sensor 101 can also include a sensing element 109. As shown in FIG. 1, the sensing element 109 can be disposed on a surface of the membrane substrate 104, e.g., on the deformable membrane 113. Optionally, in some implementations, the MEMS force sensor 101 can include a plurality of sensing elements 109 disposed on a surface of the membrane substrate 104. This disclosure contemplates that the sensing element(s) 109 can be diffused, deposited, or implanted on a surface of the membrane substrate 104. The sensing element 109 can change an electrical characteristic (e.g., resistance, capacitance, charge, etc.) in response to a deflection of the deformable membrane 113. In one implementation, the sensing element 109 can optionally be a piezoresistive transducer. Although piezoresistive transducers are provided as an example sensing element, this disclosure contemplates that the sensing element 109 can be any sensing element configured to change at least one electrical characteristic (e.g., resistance, charge, capacitance, etc.) based on an amount or magnitude of an applied force and can output a signal proportional to the amount or magnitude of the applied force. Other types of sensing elements include, but are not limited to, piezoelectric or capacitive sensors.

As discussed above, the sensing element 109 can, optionally, be a piezoresistive transducer. The change in the electrical characteristic can be measured as an analog electrical signal and, optionally, received at and processed by digital circuitry (e.g., CMOS circuitry). For example, as strain is induced in the deformable membrane 113 proportional to a force "F" applied to the MEMS force sensor 101, a localized strain is produced on the piezoresistive transducer such that the piezoresistive transducer experiences compression or tension, depending on its specific orientation. As the piezoresistive transducer compresses and tenses, its resistivity changes in an opposite fashion. Accordingly, a Wheatstone bridge circuit including a plurality (e.g., four) of piezoresistive transducers (e.g., two of each orientation relative to strain) becomes unbalanced and produces a differential voltage across the positive signal terminal and the negative signal terminal. This differential voltage is directly proportional to the applied force "F" on the MEMS force sensor 101. Example MEMS force sensors using piezoresistive sensing elements are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Pat. No. 9,902,611, issued Feb. 27, 2018 and entitled "Miniaturized and Ruggedized Wafer Level MEMS Force Sensors;" and U.S. Pat. No. 10,466,119, issued Nov. 5, 2019 and entitled "Ruggedized Wafer Level MEMS Force Sensor with a Tolerance Trench," the disclosures of which are incorporated by reference in their entireties.

The MEMS force sensor 101 can also include an electrical connection 108, a conductive via 107, and a conductive pad 106 for routing the analog electrical signal produced by the sensing element 109. In FIG. 1, two electrical connections, two conductive vias, and two conductive pads are shown as providing electrical connection to the sensing element 109. It should be understood that the number and/or arrangement of the electrical connection 108, the conductive via 107, and the conductive pad 106 in FIG. 1 are provided only as examples. As shown in FIG. 1, the electrical connection 108, the conductive via 107, and the conductive pad 106 can be provided on the membrane substrate 104. The electrical connection 108, the conductive via 107, and the conductive pad 106 can be made of any suitable conductive material, including, but not limited to, aluminum, copper, or gold, for example. Additionally, the electrical connection 108, the conductive via 107, and the conductive pad 106 can be covered by a protective layer 105. The protective layer 105 can be made of any suitable dielectric material. As shown in FIG. 1, the protective layer 105 is provided on the surface of the membrane substrate 104, and the conductive pad 106 is provided on the protective layer 105. Additionally, the protective layer 105 can be partially opened on conductive pad 106. The electrical connection 108 and the conductive via 107 are used to electrically couple the sensing element 109 to the conductive pad 106. This facilitates the ability to mount the MEMS force sensor 101 to another circuit or substrate, such as a package substrate.

Figure 2:
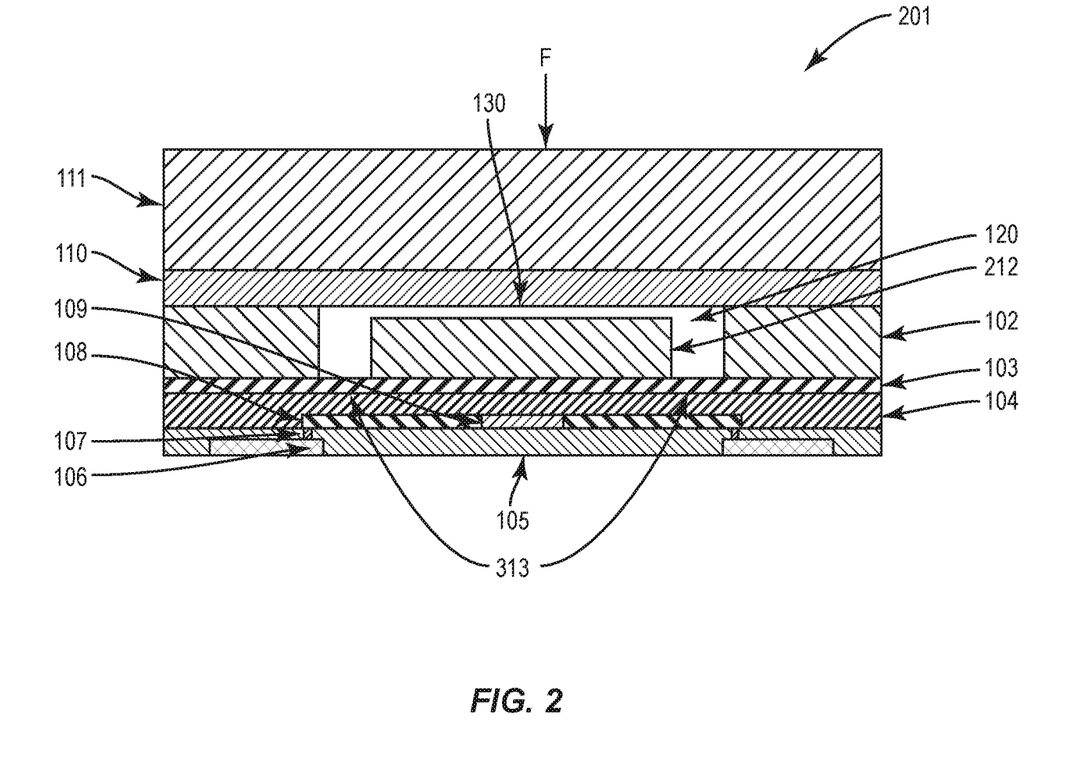
FIG. 2 illustrates another example MEMS force sensor with a sealed cavity, an etch stop layer, and a mesa sealed inside the cavity.

Referring now to FIG. 2, a MEMS force sensor 201, according to another example implementation, is shown. The MEMS force sensor 201 can include a cavity substrate 102 (also referred to herein as a "first substrate") bonded to a membrane substrate 104 (also referred to herein as a "second substrate") through an etch stop layer 103. As described herein, at least a portion of the membrane substrate 104 forms a deformable membrane 313. A cavity 120 is etched from the cavity substrate 102. Unlike the MEMS force sensor shown in FIG. 1, a mesa 212 is also formed during the etch process. The mesa 212 is used to transfer the force applied to the MEMS force sensor 201 to the deformable membrane 313. Additionally, a gap 130 (e.g., a space) is disposed between the mesa 212 and a cap substrate 111. The gap 130 can be formed during the etch process discussed above. The mesa 212 and/or the gap 130 provide overload protection for the MEMS force sensor 201. Examples of MEMS force sensors that are designed to provide overload protection are described in U.S. Pat. No. 9,487,388, issued Nov. 8, 2016 and entitled "Ruggedized MEMS Force Die;" U.S. Pat. No. 9,493,342, issued Nov. 15, 2016 and entitled "Wafer Level MEMS Force Dies;" U.S. Pat. No. 9,902,611, issued Feb. 27, 2018 and entitled "Miniaturized and Ruggedized Wafer Level MEMS Force Sensors;" and U.S. Pat. No. 10,466,119, issued Nov. 5, 2019 and entitled "Ruggedized Wafer Level MEMS Force Sensor with a Tolerance Trench," the disclosures of which are incorporated by reference in their entireties. This disclosure contemplates using etching techniques known in the art to form the cavity, mesa, and/or gap. For example, etching processes include, but are not limited to, silicon DRIE, normal RIE, wet chemical etching using KOH, or TMAH, all of which can be used to form the cavity, mesa, and/or gap. As shown in FIG. 2, the etch is stopped on an etch stop layer 103. The etch does not extend through the etch stop layer 103 and, therefore, does not reach the membrane substrate 104. The etch process is well controlled by the etch rate ratio between the respective materials of the cavity substrate 102 (e.g., silicon) and the etch stop layer 103 (e.g., silicon dioxide). For example, the etch rate ratio between an etch rate of the material of the cavity substrate 102 (e.g., silicon) and an etch rate of the material of the etch stop layer 103 can, optionally, be in the range from 50 to 150. In some implementations, the etch rate ratio is greater than or equal to 50. In some implementations, the etch rate ratio is greater than or equal to 60. In some implementations, the etch rate ratio is greater than or equal to 70. In some implementations, the etch rate ratio is greater than or equal to 80. In some implementations, the etch rate ratio is greater than or equal to 90. In some implementations, the etch rate ratio is greater than or equal to 100. In some implementations, the etch rate ratio is greater than or equal to 110. In some implementations, the etch rate ratio is greater than or equal to 120. In some implementations, the etch rate ratio is greater than or equal to 130. In some implementations, the etch rate ratio is greater than or equal to 140. In some implementations, the etch rate ratio is greater than or equal to 150. This disclosure contemplates using materials other than those provided as examples, such as GaAs or SiC for the cavity substrate 102 and/or silicon nitride or sapphire for the etch stop layer 103. As discussed above, the thickness of the deformable membrane 313, which is formed from the membrane substrate 104, can, therefore, be precisely controlled. In particular, the thickness can be precisely controlled with the processes used to fabricate the membrane substrate 104, and the etch stop layer 103 can absorb any non-uniformity introduced by the etch process used to form the cavity, mesa, and/or gap from the cavity substrate 102. And, by precisely controlling deformable membrane thickness using the etch stop layer 103 to stop the etch process, it is possible to precisely control sensitivity of the MEMS force sensor 201.

The MEMS force sensor 201 can include the cap substrate 111. The cap substrate 111 can be bonded to the cavity substrate 102 using techniques known in the art including, but not limited to, silicon fusion bonding, anodic bonding, glass frit, thermo-compression, and eutectic bonding. For example, as shown in FIG. 2, the cavity substrate 102 is bonded to the cap substrate 111 through a bond layer 110. This disclosure contemplates that the bond layer 110 can, optionally, be formed of a silicon oxide. The cavity 120 is sealed between the cavity substrate 102 and the cap substrate 111, as described herein. Thus, a volume enclosed by the cap substrate 111 and the cavity substrate 102 is sealed from an environment external to the MEMS force sensor 201.

The MEMS force sensor 201 can also include a sensing element 109. As shown in FIG. 2, the sensing element 109 can be disposed on a surface of the membrane substrate 104. Optionally, in some implementations, the MEMS force sensor 201 can include a plurality of sensing elements 109 disposed on a surface of the membrane substrate 104. This disclosure contemplates that the sensing element(s) 109 can be diffused, deposited, or implanted on a surface of the membrane substrate 104. The sensing element 109 can change an electrical characteristic (e.g., resistance, capacitance, charge, etc.) in response to deflection of the deformable membrane 313. In one implementation, the sensing element 109 can, optionally, be a piezoresistive transducer. Although piezoresistive transducers are provided as an example sensing element, this disclosure contemplates that the sensing element 109 can be any sensing element configured to change at least one electrical characteristic (e.g., resistance, charge, capacitance, etc.) based on an amount or magnitude of an applied force and can output a signal proportional to the amount or magnitude of the applied force. Other types of sensing elements include, but are not limited to, piezoelectric or capacitive sensors.

The MEMS force sensor 201 can also include an electrical connection 108, a conductive via 107, and a conductive pad 106 for routing the analog electrical signal produced by the sensing element 109. In FIG. 2, two electrical connections, two conductive vias, and two conductive pads are shown for providing an electrical connection to the sensing element 109. It should be understood that the number and/or arrangement of the electrical connection 108, the conductive via 107, and the conductive pad 106 in FIG. 2 are provided only as examples. As shown in FIG. 2, the electrical connection 108, the conductive via 107, and the conductive pad 106 can be provided on the membrane substrate 104. The electrical connection 108, the conductive via 107, and the conductive pad 106 can be made of any suitable conductive material, including, but not limited to, aluminum, copper, or gold, for example. Additionally, the electrical connection 108, the conductive via 107, and the conductive pad 106 can be covered by a protective layer 105. The protective layer 105 can be made of any suitable dielectric material. As shown in FIG. 2, the protective layer 105 is provided on the surface of the membrane substrate 104, and the conductive pad 106 is provided on the protective layer 105. Additionally, the protective layer 105 can be partially opened on conductive pad 106. The electrical connection 108 and the conductive via 107 are used to electrically couple the sensing element 109 to the conductive pad 106. This facilitates the ability to mount the MEMS force sensor 201 to another circuit or substrate, such as a package substrate.

Figure 3:
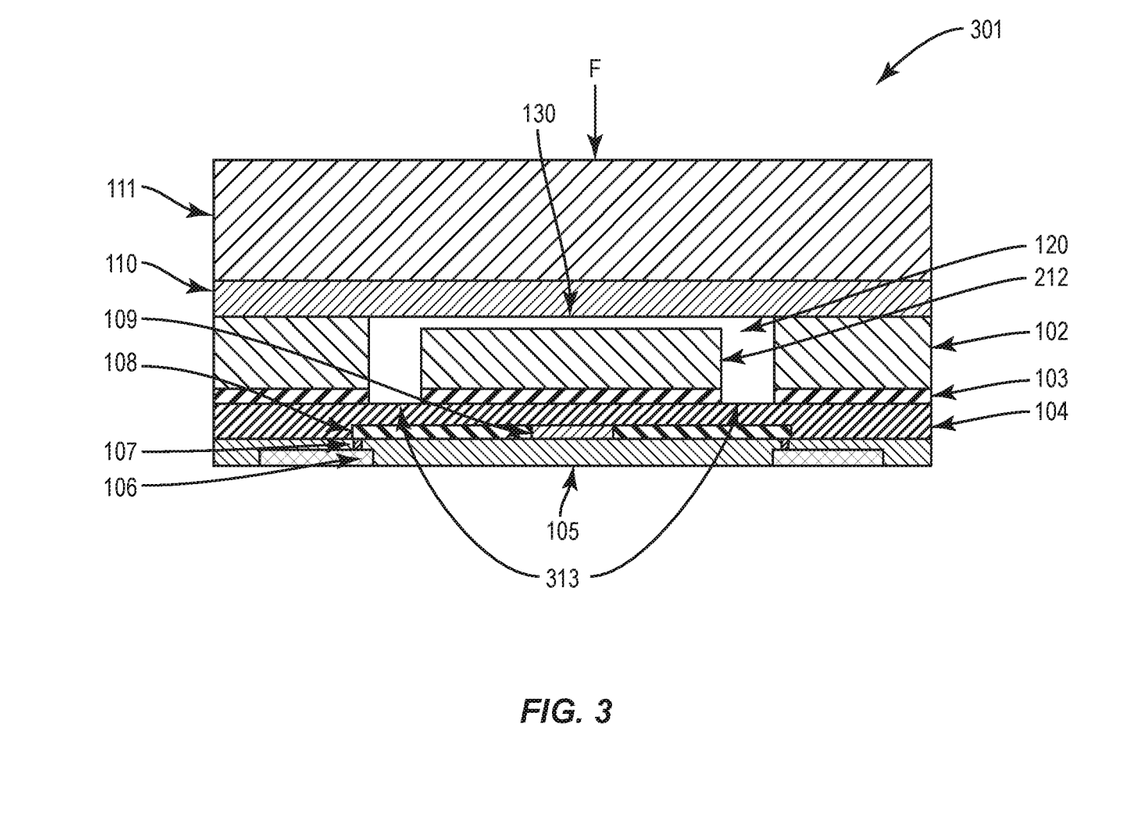
FIG. 3 illustrates another example MEMS force sensor with a sealed cavity, an etch stop layer, and a mesa sealed inside the cavity.

Referring now to FIG. 3, a MEMS force sensor 301, according to yet another example implementation, is shown. The MEMS force sensor 301 can include a cavity substrate 102 (also referred to herein as a "first substrate") bonded to a membrane substrate 104 (also referred to herein as a "second substrate") through an etch stop layer 103. As described herein, at least a portion of the membrane substrate 104 forms a deformable membrane 313. A cavity 120 is etched from the cavity substrate 102. Unlike the MEMS force sensor shown in FIG. 1, a mesa 212 is also formed during the etch process. The mesa 212 is used to transfer the force applied to the MEMS force sensor 301 to the deformable membrane 313. Additionally, a gap 130 (e.g., a space) is disposed between the mesa 212 and cap substrate 111. The gap 130 can be formed during the etch process discussed above. The mesa 212 and/or the gap 130 provide(s) overload protection for the MEMS force sensor 301. This disclosure contemplates using etching techniques known in the art to form the cavity, mesa, and/or gap. For example, etching processes include, but are not limited to, silicon DRIE, normal RIE, wet chemical etching using KOH, or TMAH, all of which can be used to form the cavity, mesa, and/or gap. Similarly to FIG. 1 and FIG. 2, the etch can be stopped on an etch stop layer 103. The etch does not extend through the etch stop layer 103 and, therefore, does not reach the membrane substrate 104. The etch process is well controlled by the etch rate ratio between the respective materials of the cavity substrate 102 (e.g., silicon) and the etch stop layer 103 (e.g., silicon dioxide). For example, the etch rate ratio between an etch rate of the material of the cavity substrate 102 (e.g., silicon) and an etch rate of the material of the etch stop layer 103 can optionally be in the range from 50 to 150. In some implementations, the etch rate ratio is greater than or equal to 60. In some implementations, the etch rate ratio is greater than or equal to 70. In some implementations, the etch rate ratio is greater than or equal to 80. In some implementations, the etch rate ratio is greater than or equal to 90. In some implementations, the etch rate ratio is greater than or equal to 100. In some implementations, the etch rate ratio is greater than or equal to 110. In some implementations, the etch rate ratio is greater than or equal to 120. In some implementations, the etch rate ratio is greater than or equal to 130. In some implementations, the etch rate ratio is greater than or equal to 140. In some implementations, the etch rate ratio is greater than or equal to 150. This disclosure contemplates using materials other than those provided as examples such as GaAs or SiC for the cavity substrate 102 and/or silicon nitride or sapphire for the etch stop layer 103. As discussed above, the thickness of the deformable membrane 313, which is formed from the membrane substrate 104, can, therefore, be precisely controlled. In particular, the thickness can be precisely controlled with the processes used to fabricate the membrane substrate 104, and the etch stop layer 103 can absorb any non-uniformity introduced by the etch process used to form the cavity, mesa, and/or gap from the cavity substrate 102. And, by precisely controlling deformable membrane thickness using the etch stop layer 103 to stop the etch process, it is possible to precisely control the sensitivity of the MEMS force sensor 301.

As shown in FIG. 3, portions of the etch stop layer 103 covering the deformable membrane 313 can be removed after forming the cavity, mesa, and/or gap. In FIG. 3, these portions correspond to regions of the membrane substrate 104 disposed about the mesa 212. This disclosure contemplates removing portions of the etch stop layer 103 by using an etch process. By removing portions of the etch stop layer 103, the thickness of the deformable membrane 313 can be further precisely controlled. In other words, the deformable membrane 313 is the only material left in the regions where the etch stop layer 103 has been removed. As discussed above, the thickness of the deformable membrane affects sensitivity of the MEMS force sensor 301, so removing portions of the etch stop layer 103, which adds material and thickness, facilitates controlling sensitivity.

The MEMS force sensor 301 can include a cap substrate 111. The cap substrate 111 can be bonded to the cavity substrate 102 using techniques known in the art including, but not limited to, silicon fusion bonding, anodic bonding, glass frit, thermo-compression, and eutectic bonding. For example, as shown in FIG. 3, the cavity substrate 102 is bonded to the cap substrate 111 through a bond layer 110. This disclosure contemplates that the bond layer 110 can, optionally, be formed of a silicon oxide. The cavity 120 is sealed between the cavity substrate 102 and the cap substrate 111, as described herein. Thus, a volume enclosed by the cap substrate 111 and the cavity substrate 102 is sealed from an environment external to the MEMS force sensor 301.

The MEMS force sensor 301 can also include a sensing element 109. As shown in FIG. 3, the sensing element 109 can be disposed on a surface of the membrane substrate 104. Optionally, in some implementations, the MEMS force sensor 301 can include a plurality of sensing elements 109 disposed on a surface of the membrane substrate 104. This disclosure contemplates that the sensing element(s) 109 can be diffused, deposited, or implanted on a surface of the membrane substrate 104. The sensing element 109 can change an electrical characteristic (e.g., resistance, capacitance, charge, etc.) in response to the deflection of the deformable membrane 313. In one implementation, the sensing element 109 can optionally be a piezoresistive transducer. Although piezoresistive transducers are provided as an example sensing element, this disclosure contemplates that the sensing element 109 can be any sensor element configured to change at least one electrical characteristic (e.g., resistance, charge, capacitance, etc.) based on an amount or magnitude of an applied force and can output a signal proportional to the amount or magnitude of the applied force. Other types of sensing elements include, but are not limited to, piezoelectric or capacitive sensors.

The MEMS force sensor 301 can also include an electrical connection 108, a conductive via 107, and a conductive pad 106 for routing the analog electrical signal produced by the sensing element 109. In FIG. 3, two electrical connections, two conductive vias, and two conductive pads are shown for providing electrical connection to the sensing element 109. It should be understood that the number and/or arrangement of the electrical connection 108, the conductive via 107, and the conductive pad 106 in FIG. 3 are provided only as examples. As shown in FIG. 3, the electrical connection 108, the conductive via 107, and the conductive pad 106 can be provided on the membrane substrate 104. The electrical connection 108, the conductive via 107, and the conductive pad 106 can be made of any suitable conductive material, including, but not limited to, aluminum, copper, or gold, for example. Additionally, the electrical connection 108, the conductive via 107, and the conductive pad 106 can be covered by a protective layer 105. The protective layer 105 can be made of any suitable dielectric material. As shown in FIG. 2, the protective layer 105 is provided on the surface of the membrane substrate 104, and the conductive pad 106 is provided on the protective layer 105. Additionally, the protective layer 105 can be partially opened on conductive pad 106. The electrical connection 108 and the conductive via 107 are used to electrically couple the sensing element 109 to the conductive pad 106. This facilitates the ability to mount the MEMS force sensor 301 to another circuit or substrate, such as a package substrate.

Figure 4:
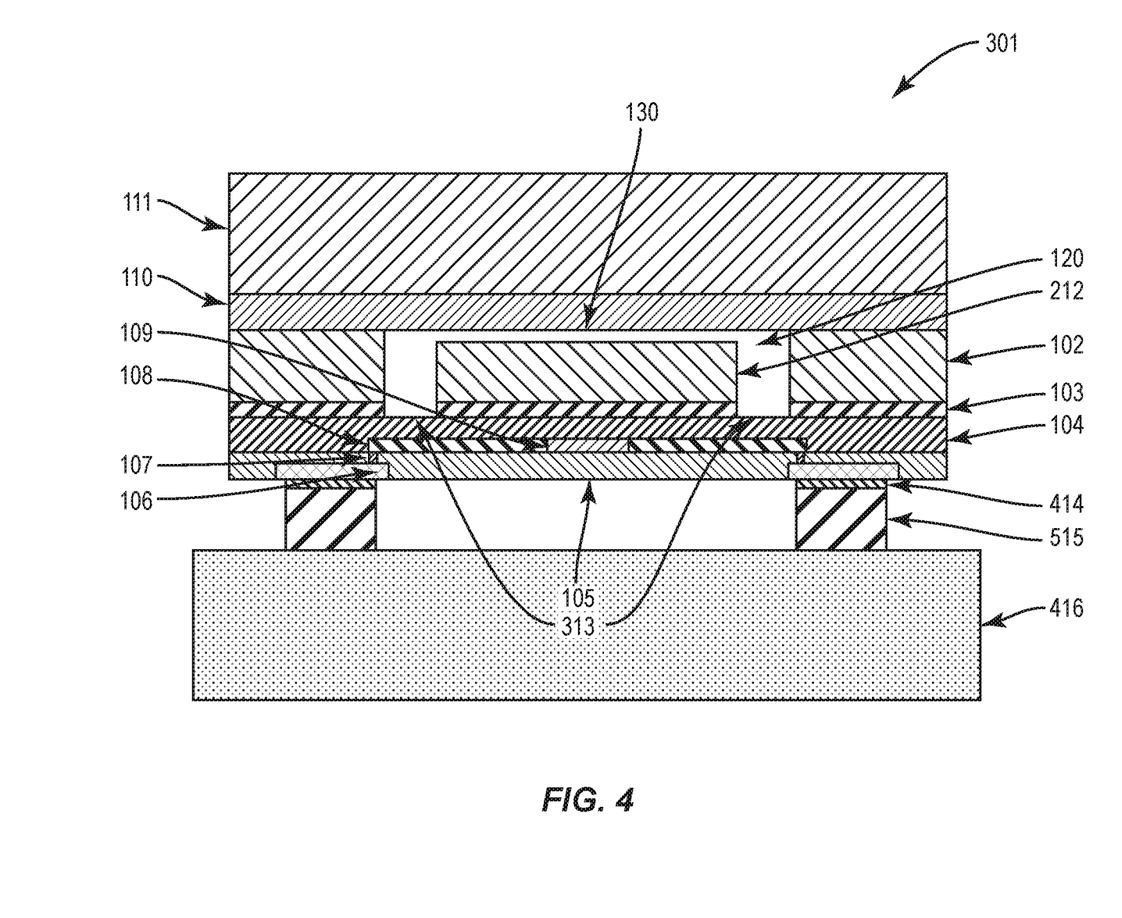
FIG. 4 illustrates an example MEMS force sensor mounted on a package substrate through solder bumps, where the solder bumps do not overlap with the membrane or the mesa of the MEMS force sensor.

Referring now to FIG. 4, an example MEMS force sensor 301 mounted on a package substrate 416 through solder bumps, where the solder bumps do not overlap with the membrane or the mesa of the MEMS force sensor 301, is shown. The MEMS force sensor 301 is described in detail above with reference to FIG. 3. It should be understood that the MEMS force sensors shown in FIG. 1 and FIG. 2 can be mounted on a package substrate as described herein. In other words, the MEMS force sensor 301 is used only as an example in FIG. 4.

As shown in FIG. 4, an under bump metal (UBM) layer 414 can be formed on each of the conductive pads 106. This disclosure contemplates that the UBM layer 414 can be made of any suitable conductive material, including, but not limited to, aluminum, copper, or gold, for example. The UBM layer 414 is formed in the opening of the protective layer 105 that exposes the conductive pads 106. Additionally, the bumps 415 (e.g., solder bumps) are formed on the UBM layer 414. The MEMS force sensor 301 can then be mechanically and electrically coupled to the package substrate 416 via the bumps 415. Although the bumps 415 are provided as an example, this disclosure contemplates that copper pillars or any other component capable of electrically connecting the MEMS force sensor 301 to the package substrate 416 can be used. The package substrate 416 can, optionally, be a printed circuit board (PCB) or a flexible printed circuit board (FPCB). PCBs and FPCBs, such as those used in electronics systems as a carrier substrate to electrically and mechanically integrate a functional system together, are known in the art and, therefore, will not be described in further detail herein. As shown in FIG. 4, the conductive pad 106, the UBM layer 414, and the bumps 415 are arranged on the membrane substrate 104 and do not overlap with either the deformable membrane 313 or the mesa 212 of the MEMS force sensor 301.

Figure 5:
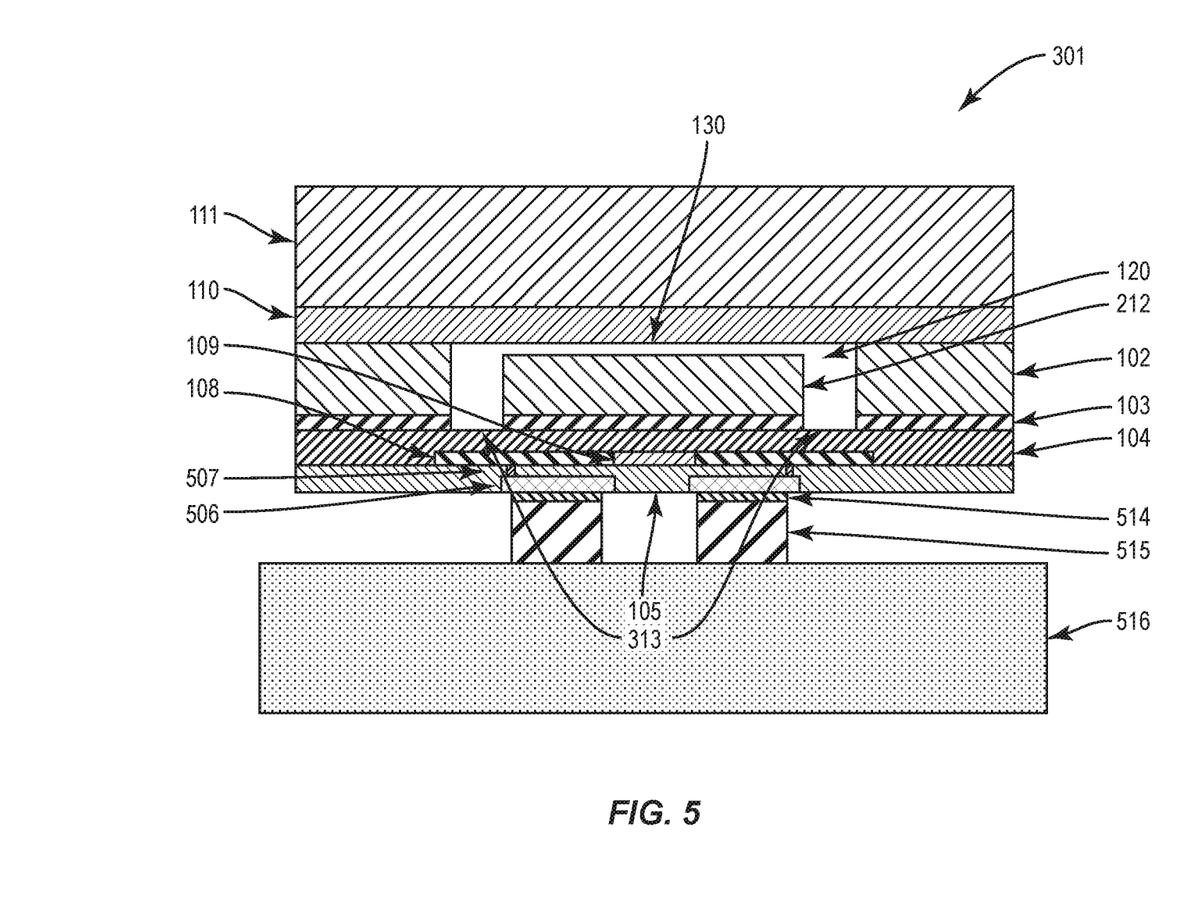
FIG. 5 illustrates another example MEMS force sensor mounted on a package substrate through solder bumps, where the solder bumps fully overlap with the mesa of the MEMS force sensor.

Referring now to FIG. 5, an example MEMS force sensor 301 mounted on a package substrate 516 through solder bumps, where the solder bumps fully overlap with the mesa of the MEMS force sensor 301, is shown. The MEMS force sensor 301 is described in detail above with reference to FIG. 3. It should be understood that the MEMS force sensors shown in FIG. 1 and FIG. 2 can be mounted on a package substrate as described herein. In other words, the MEMS force sensor 301 is used only as an example in FIG. 5.

As shown in FIG. 5, a UBM layer 514 can be formed on each of the conductive pads 106. This disclosure contemplates that the UBM layer 514 can be made of any suitable conductive material, including, but not limited to, aluminum, copper, or gold, for example. The UBM layer 514 is formed in the opening of the protective layer 105 that exposes the conductive pads 106. Additionally, the bumps 515 (e.g., solder bumps) are formed on the UBM layer 514. The MEMS force sensor 301 can then be mechanically and electrically coupled to the package substrate 516 via the bumps 515. Although the bumps 515 are provided as an example, this disclosure contemplates that copper pillars or any other component capable of electrically connecting the MEMS force sensor 301 to the package substrate 516 can be used. The package substrate 516 can, optionally, be a PCB or a FPCB. PCBs and FPCBs, such as those used in electronics systems as a carrier substrate to electrically and mechanically integrate a functional system together, are known in the art and, therefore, will not be described in further detail herein. As shown in FIG. 5, the conductive pad 106, the UBM layer 514, and the bumps 515 are arranged on the membrane substrate 104 and overlap with the mesa 212 of the MEMS force sensor 301.

An example method of manufacturing the MEMS force sensor is now described. It should be understood that the MEMS force sensor can be the MEMS force sensor described above with regard to FIGS. 1-3. The method can include providing a first substrate (e.g., the cavity substrate 102 in FIGS. 1-3), a second substrate (e.g., the membrane substrate 104 in FIGS. 1-3), and an etch stop layer (e.g., the etch stop layer 103 in FIGS. 1-3). As described herein, the etch stop layer can be arranged between the cavity and membrane substrates. A sensing element (e.g., the sensing element 109 in FIGS. 1-3) can be arranged on a surface of the membrane substrate. The sensing element (e.g., the piezoresistive or piezoelectric sensing element) can, optionally, be formed using an implant or deposition process. The formation of sensing elements is known in the art. For example, the formation of sensing elements is described in International Patent Application No. WO2018/148503 to Foughi et al., published Aug. 16, 2018 and entitled "Integrated Digital Force Sensors and Related Methods of Manufacture," the disclosure of which is incorporated by reference in its entirety. The method can further include etching the cavity substrate, where the etch process removes a portion of the first substrate to form a cavity (e.g., the cavity 120 in FIGS. 1-3) and, optionally, a mesa and a gap (e.g., the mesa 212 and the gap 130 in FIG. 2 and FIG. 3). This disclosure contemplates using etching techniques known in the art. For example, etching processes include, but are not limited to, silicon DRIE, normal RIE, wet chemical etching using KOH, or TMAH, all of which can be used to form the cavity, mesa, and/or gap. In some implementations, the etch process can, optionally, remove a portion of the etch stop layer. For example, the etch stop layer can, optionally, be completely removed, exposing a portion of the membrane substrate (e.g., as shown in FIG. 3). In this implementation, the etch process does not remove a portion of the membrane substrate.

As described herein, the etch stop layer can be configured for precise thickness control of a deformable membrane (e.g., the deformable membrane 113/313 in FIGS. 1-3) defined by at least a portion of the membrane substrate. For example, an etch rate of the etch stop layer can be different than an etch rate of the cavity substrate. For example, the etch rate ratio between an etch rate of the material of the cavity substrate and an etch rate of the material of the etch stop layer can optionally be in the range from 50 to 150. In some implementations, the etch rate ratio is greater than or equal to 50. In some implementations, the etch rate ratio is greater than or equal to 60. In some implementations, the etch rate ratio is greater than or equal to 70. In some implementations, the etch rate ratio is greater than or equal to 80. In some implementations, the etch rate ratio is greater than or equal to 90. In some implementations, the etch rate ratio is greater than or equal to 100. In some implementations, the etch rate ratio is greater than or equal to 110. In some implementations, the etch rate ratio is greater than or equal to 120. In some implementations, the etch rate ratio is greater than or equal to 130. In some implementations, the etch rate ratio is greater than or equal to 140. In some implementations, the etch rate ratio is greater than or equal to 150. This allows the etch stop layer to absorb any non-uniformity introduced by the etch process used to form the cavity, mesa, and/or gap from the cavity substrate. In some implementations, the method can further include bonding a cap substrate (e.g., the cap 111 in FIGS. 1-3) to the cavity substrate, such that the cavity is sealed between the cap substrate and the cavity substrate.

In one implementation, the step of bonding the cap substrate (e.g., the cap 111 in FIGS. 1-3) is performed before the step of forming the sensing element (e.g., the sensing element 109 in FIGS. 1-3). In this implementation, the etch stop layer (e.g., the etch stop layer 103 in FIGS. 1-3), which is optionally formed of $S_1O_2$ or SiC, is provided on the second substrate (e.g. the membrane substrate 104 in FIGS. 1-3). The membrane substrate has a precisely controlled thickness, as described herein. The first substrate (e.g. the cavity substrate 102 in FIGS. 1-3) is then provided on the etch stop layer. Thereafter, the etching steps are performed, e.g., to form a cavity (e.g., the cavity 120 in FIGS. 1-3) and, optionally, a mesa and a gap (e.g., the mesa 212 and the gap 130 in FIG. 2 and FIG. 3). The cap substrate is then bonded to the cavity substrate such that the cavity is sealed there between. After this bonding, the sensing element can be formed as described herein.

In another implementation, the step of bonding the cap substrate (e.g., the cap 111 in FIGS. 1-3) is performed after the step of forming the sensing element (e.g., the sensing element 109 in FIGS. 1-3). In this implementation, a transfer wafer is used. The sensing element is formed on the second substrate (e.g. the membrane substrate 104 in FIGS. 1-3), which has a precisely controlled thickness, as described herein. The membrane substrate is bonded to the transfer wafer. The etch stop layer (e.g., the etch stop layer 103 in FIGS. 1-3), which is optionally formed of $S_1O_2$ or SiC, is then provided on the membrane substrate. The first substrate (e.g. the cavity substrate 102 in FIGS. 1-3) is then provided on the etch stop layer. Thereafter, the etching steps are performed, e.g., to form a cavity (e.g., the cavity 120 in FIGS. 1-3) and, optionally, a mesa and a gap (e.g., the mesa 212 and the gap 130 in FIG. 2 and FIG. 3). Using the transfer wafer, the cavity and membrane substrates are carried to the cap substrate for bonding. The cap substrate is then bonded to the cavity substrate such that the cavity is sealed there between. After this bonding, the transfer wafer is removed.

Optionally, the method can further include providing a protective layer (e.g., the protective layer 105 in FIGS. 1-3) arranged on the surface of the membrane substrate and providing a conductive pad (e.g., the conductive pad 106 in FIGS. 1-3) arranged on the protective layer. The sensing element can be electrically coupled to the conductive pad, and the protective layer can at least partially cover one or more of the sensing elements, the surface of the second substrate, and the conductive pad. In some implementations, the method can further include providing a UBM layer (e.g., the UBM layers 414/514 in FIG. 4 and FIG. 5) and a solder bump (e.g., the solder bumps 415/515 in FIG. 4 and FIG. 5) or a copper pillar arranged on the conductive pad. This disclosure contemplates that the UBM layer and the solder bump or the copper pillar can be provided after the formation of the sensor die has been completed. Optionally, the method can include bonding the MEMS force sensor to a package substrate (e.g., the package substrates 416/516 in FIG. 4 and FIG. 5). As described herein, the package substrate can be a PCB or an FPCB. The MEMS force sensor can be mounted on the package substrate using the UBM layer and the solder bump or the copper pillar.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A microelectromechanical system (MEMS) force sensor, comprising:
    a sensor die configured to receive an applied force, the sensor die comprising a first substrate and a second substrate, wherein a cavity is formed in the first substrate, and wherein at least a portion of the second substrate defines a deformable membrane;
    an etch stop layer arranged between the first substrate and the second substrate;
    a sensing element arranged on a surface of the second substrate, wherein the sensing element is configured to convert a strain on the surface of a membrane substrate to an analog electrical signal that is proportional to the strain;
    wherein the etch stop layer is configured for precise thickness control of the deformable membrane of the membrane substrate;
    wherein an etch rate of the etch stop layer is different than an etch rate of the first substrate; and
    wherein an etch rate ratio between the etch rate of the first substrate and the etch rate of the etch stop layer is between 50 and 150.

2. The MEMS force sensor of claim 1, further comprising:
    a protective layer arranged on the surface of the second substrate; and
    a conductive pad arranged on the protective layer, wherein the sensing element is electrically coupled to the conductive pad, wherein the protective layer at least partially covers the sensing element, the surface of the second substrate, and the conductive pad.

3. The MEMS force sensor of claim 2, further comprising an under bump metal (UBM) layer and a solder bump, wherein the MEMS force sensor is mounted on a package substrate using the UBM layer and the solder bump.

4. The MEMS force sensor of claim 3, wherein the conductive pad, the UBM layer, and the solder bump are overlapping fully with a mesa formed from the first substrate.

5. The MEMS force sensor of claim 3, wherein the conductive pad, the UBM layer, and the solder bump are not overlapping with a mesa formed from the first substrate or the deformable membrane defined by the second substrate.

6. The MEMS force sensor of claim 3, wherein the conductive pad is electrically coupled to the package substrate through the UBM layer and the solder bump.

7. The MEMS force sensor of claim 3, wherein the package substrate is a printed circuit board (PCB) or a flexible printed circuit board (FPCB).

8. The MEMS force sensor of claim 1, further comprising a mesa formed from the first substrate.

9. The MEMS force sensor of claim 1, wherein the etch stop layer covers the deformable membrane of the membrane substrate.

10. The MEMS force sensor of claim 1, wherein the etch stop layer is removed from the deformable membrane of the membrane substrate.

11. The MEMS force sensor of claim 1, wherein the etch stop layer is composed of silicon dioxide, silicon nitride, or sapphire.

12. The MEMS force sensor of claim 1, further comprising a plurality of sensing elements arranged on the surface of the second substrate.

13. The MEMS force sensor of claim 1, wherein the sensing element is a piezoresistive or piezoelectric sensing element.

14. The MEMS force sensor of claim 1, further comprising a cap substrate, wherein the cap substrate is bonded to the first substrate, and wherein the cavity is sealed between the cap substrate and the first substrate.

15. A method of manufacturing a microelectromechanical system (MEMS) force sensor, the method comprising:
providing a first substrate, a second substrate, and an etch stop layer, wherein the etch stop layer is arranged between the first substrate and the second substrate, and wherein a sensing element is arranged on a surface of the second substrate;
etching the first substrate, wherein an etch process removes a portion of the first substrate to form a cavity in the first substrate;
wherein the etch stop layer is configured for precise thickness control of a deformable membrane of a membrane substrate;
wherein an etch rate of the etch stop layer is different than an etch rate of the first substrate; and
wherein an etch rate ratio between the etch rate of the first substrate and the etch rate of the etch stop layer is between 50 and 150.

16. The method of claim 15, wherein the etch process removes a portion of the etch stop layer.

17. The method of claim 15, wherein the etch process does not remove a portion of the second substrate.

18. The method of claim 17, wherein the etch process further forms a mesa in the first substrate.

19. The method of claim 18, further comprising bonding a cap substrate to the first substrate, wherein the cavity is sealed between the cap substrate and the first substrate.

20. The method of claim 15, wherein the MEMS force sensor is provided in an integrated circuit.

* * * * *